US007944693B2

(12) United States Patent
Kempf

(10) Patent No.: US 7,944,693 B2
(45) Date of Patent: May 17, 2011

(54) HOUSING FOR HOLDING ELECTRONIC PLUG-IN ASSEMBLIES

(75) Inventor: Heinz Kempf, Calw-Altburg (DE)

(73) Assignee: Schroff GmbH, Straubenhardt (DE)

( * ) Notice: Subject to any disclaimer, the term of this patent is extended or adjusted under 35 U.S.C. 154(b) by 128 days.

(21) Appl. No.: 12/393,376

(22) Filed: Feb. 26, 2009

(65) Prior Publication Data
US 2009/0219689 A1 Sep. 3, 2009

(30) Foreign Application Priority Data
Mar. 3, 2008 (EP) ..................................... 08152223

(51) Int. Cl.
*H05K 7/20* (2006.01)
(52) U.S. Cl. .............. 361/695; 361/679.48; 361/679.49; 361/688; 361/690; 361/697; 165/122; 454/184
(58) Field of Classification Search .................. 361/688, 361/690, 695, 697, 679.48, 679.49, 704
See application file for complete search history.

(56) References Cited

U.S. PATENT DOCUMENTS

| 5,409,419 | A * | 4/1995 | Euchner et al. ............... 454/184 |
| 6,042,474 | A | 3/2000 | Harvey et al. |
| 6,181,557 | B1 * | 1/2001 | Gatti ............................ 361/695 |
| 6,504,717 | B1 * | 1/2003 | Heard ........................... 361/695 |
| 6,594,148 | B1 * | 7/2003 | Nguyen et al. ................ 361/695 |
| 7,016,193 | B1 * | 3/2006 | Jacques et al. ................ 361/695 |
| 7,154,748 | B2 * | 12/2006 | Yamada ........................ 361/690 |
| 7,430,117 | B2 * | 9/2008 | Shabany ....................... 361/695 |
| 2003/0214785 | A1 | 11/2003 | Perazzo |
| 2005/0241810 | A1 * | 11/2005 | Malone et al. ................ 165/122 |
| 2005/0250435 | A1 | 11/2005 | Sharp et al. |
| 2007/0082598 | A1 | 4/2007 | Kempf et al. |
| 2008/0212265 | A1 | 9/2008 | Mazura et al. |
| 2009/0262499 | A1 * | 10/2009 | Chou ............................ 361/695 |

FOREIGN PATENT DOCUMENTS

| DE | 8902015 | 5/1989 |
| DE | 10008019 | 8/2001 |
| DE | 102005056096 | 5/2007 |
| EP | 1705977 | 9/2006 |
| JP | 6314892 A | 11/1994 |

OTHER PUBLICATIONS

Patent Search Report for EP 08152223.7, dated Jul. 23, 2008 (4 pages).

* cited by examiner

*Primary Examiner* — Jayprakash N Gandhi
*Assistant Examiner* — Courtney Smith
(74) *Attorney, Agent, or Firm* — Gardere Wynne Sewell LLP; Marc A. Hubbard

(57) ABSTRACT

A housing for holding electronic plug-in assemblies having a component installation space open toward the front side of the housing for the plug-in assemblies and a fan space arranged above the component installation space with a cover plate and a lateral air outlet. The fan space contains at least one axial fan with an air outlet on the top side of the fan. The axial fan is arranged in the fan space such that air is drawn out from the component installation space. An air-guiding plate that runs in the direction of the air outlet of the fan space is positioned between the top side of the fan and the cover plate of the fan space.

20 Claims, 5 Drawing Sheets

HOUSING FOR HOLDING ELECTRONIC PLUG-IN ASSEMBLIES

TECHNICAL FIELD OF THE INVENTION

The present invention relates to a housing for holding electronic plug-in assemblies with a component installation space open toward the front side of the housing for the plug-in assemblies and a fan space arranged above the component installation space with a lateral air outlet and an axial fan.

BACKGROUND OF THE INVENTION

Housings with electronic plug-in assemblies are typically integrated in control cabinets. The structural height of the housing must be as small as possible in relation to the inserted plug-in assemblies, so that the available space in the control cabinet is used optimally and costs related to the footprint of the control cabinet can be reduced.

However, due to the high density of electronic plug-in assemblies, problems arise with heating. The amount of heat dissipated by the plug-in assemblies has increased steadily due to higher packing densities and timing frequencies of the plug-in assemblies. Thus, increased cooling requirements are placed on systems and especially the housing for holding the plug-in assemblies.

In the field of telecommunications, particularly strong cooling is required because standards in the field of telecommunications applications permit heat dissipation of greater than 200 W for each plug-in assembly. The ATCA standard housing (Advanced Telecom Computing Architecture) developed by PICMG (PCI Industrial Computing Manufacture Group) typically provides space for 14-16 adjacent plug-in assemblies. The total amount of heat dissipation is thus approximately 3000 W. This heat must be effectively removed in order to prevent overheating and failure of the plug-in assemblies.

In order to optimally use the available space in the control cabinets, the individual housings have only relatively small spatial requirements for guiding the cooling air. This reduction in space for guiding cooling air stands diametrically opposed to the growing amount of heat dissipated and stricter cooling requirements.

In the state of the art, telecommunications systems are known in which several small fans are arranged underneath the component installation space of the plug-in assemblies and air is forced vertically upward along the plug-in assemblies. The cooling air is then discharged laterally from the housing, usually on the rear side, above the component installation space. Because the incoming cool air flows around the fans, their temperature load is low, which has a positive effect on their service life. However, the air conduction above the component installation space is less effective.

In other housings, axial fans are arranged above the plug-in assembly. In order to improve air conduction and prevent a blockage of air in the space above the component installation space, it is known to place the individual fans at an angle, so that the discharged air flows past the other fans. However, this arrangement often cannot be realized due to the given structural height of the housing. One example here is US 2003/0214785 A1. Another example for the arrangement and use of axial fans for cooling housings is known from U.S. Pat. No. 6,042,474.

Instead of axial fans, particularly, in housings for telecommunications applications, radial fans are often used that involve a structural 90°-deflection of the airflow. The radial fans arranged above the component installation space of the plug-in assemblies draw in air from below and discharge it laterally through the air outlet of the housing. One possibility for the effective cooling of such ATCA standard housings for telecommunications applications is known, for example, from EP 1 705 977. However, the use of radial fans is relatively expensive.

SUMMARY

A housing for holding electronic plug-in assemblies in accordance with the teachings of a preferred embodiment of the invention has a component installation space for holding plug-in assemblies that is open toward the front side of the housing. Above the component installation space there is a fan space in which at least one axial fan is located. The fan space has a cover plate closing the top and a lateral air outlet. The lateral air outlet is preferably arranged on the rear side of the housing.

An air outlet at the top side of the fan is provided to the axial fan. It is arranged in the fan space such that air is drawn out of the component installation space. The drawn air flows out from the housing from the lateral air outlet of the fan space. Between the top side of the axial fan and the cover plate of the fan space, an air-guiding plate is positioned that extends in the direction of the air outlet of the fan space.

Due to the further development of axial fans, fans can now be used that generate a high air output such that the disadvantages due to the lack of air conduction with a 90° deflection have no or only very small effects on ventilation of the housing. Despite individual eddies forming region by region in the fan space above the component installation space of the plug-in assemblies, the ventilation capacity is sufficient. This is especially due to the very high rotational speeds of the new fans.

However, the problem arises that due to the high airflow through the high-speed axial fans, air impacts the cover plate of the air-conduction space and is forced back against the airflow in the direction of the axial fans. In this way, air is moved by the blades of the axial fans partially back into the component installation space of the housing, whereby heated air flows through the component installation space and the total airflow is reduced due to the "leakage flow" directed in the opposite direction.

However, it was discovered that the leakage flow directed against the flow of cooling air occurs only when a column of air is formed above the outlet of the axial fan. Studies have shown that the production of such a column of air can be effectively and efficiently prevented by the arrangement as disclosed herein of the air-guiding plate above the outlet of the axial fan. The air-guiding plate divides the airflow emerging from the air outlet of the axial fan into two sub-flows, so that the problem of the backward-directed leakage flow does not occur.

Studies have shown that an air-guiding plate that runs in the direction of the air outlet of the fan space optimizes air output and prevents the production of said backward-directed leakage flow to the best extent possible.

In one exemplary embodiment of a housing, the air-guiding plate constructed as a separating plate is arranged vertically in the fan space. The usually flat air-guiding plate has a flat side that is arranged such that a line normal to its surface will be perpendicular to the fan axis, that is, to the rotational axis of the fan wheel of the axial fan.

The term "fan space," which is arranged above the component installation space, is to be understood as the space in which the axial fan is located. This space can definitely also be formed by a push-in cartridge that is pushed into a region of the housing. It is also possible that several fan spaces (arranged one next to the other) are provided above the component installation space. Such an embodiment involves, for example, two or three fan cartridges arranged one next to the other. The fan cartridges can have, on their side, one or more fans.

In another exemplary embodiment, two axial fans are contained, for example, in a fan cartridge, within the fan space. The two axial fans are preferably arranged one next to the other such that one axial fan of the fan cartridge is arranged next to the air outlet of the fan space and the other axial fan is arranged next to the side wall that lies opposite the air outlet of the fan space.

In this embodiment with two axial fans, it is further preferred if a separate air-conduction space is allocated to each axial fan. The fan space thus has two air-conduction spaces. Advantageously, the two air spaces are constructed and arranged such that they lie one above the other at least in some regions. Preferably, the air-conduction space of the axial fan adjacent to the air outlet of the fan space is arranged at least partially underneath the air-conduction space of the axial fan arranged at a distance from the air outlet.

If the air outlet of the fan space is provided at the rear housing wall, then the rear fan is arranged in its vertical position underneath the front fan, wherein the two fans preferably do not overlap.

In one preferred embodiment, the air-guiding plate is positioned in the air-conduction space in which the axial fan adjacent to the air outlet is arranged. In other words, the air-conduction space adjacent to the air outlet contains the air-guiding plate according to the invention. Two or more air-conduction spaces could also be constructed with an air-guiding plate.

BRIEF DESCRIPTION OF THE DRAWINGS

The invention will be explained in greater detail below with reference to the preferred embodiments shown in the figures. The special features shown in these figures can be used individually or in combination, in order to create preferred implementations of the invention. The described embodiments do not represent a restriction of the generality of the subject matter defined in the claims. Shown are:

DETAILED DESCRIPTION OF EXEMPLARY EMBODIMENTS

In the following description, like numbers refer to like elements.

Figure 1:
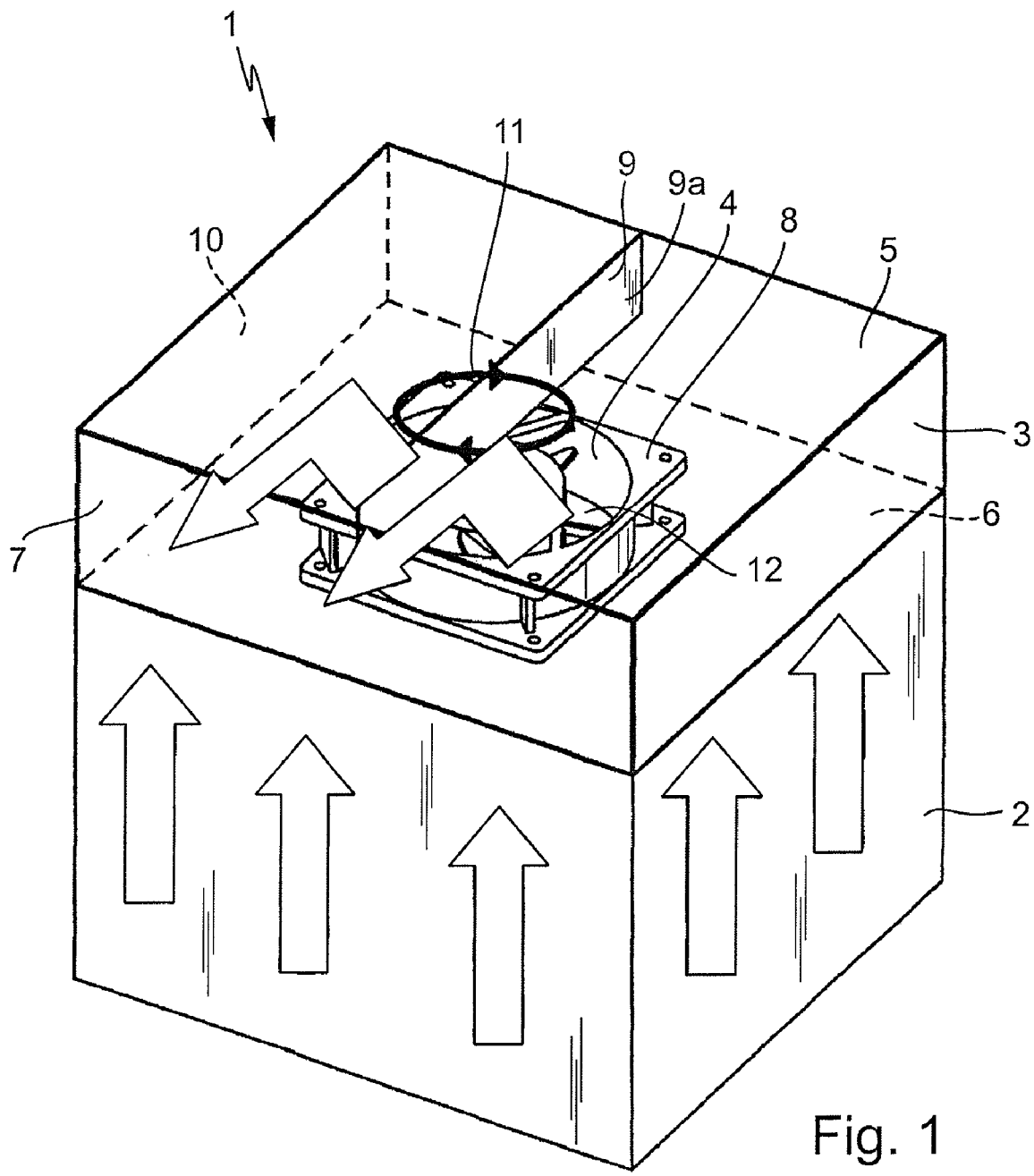
FIG. 1 is a basic diagram of a housing according to the invention with an axial fan.

FIG. 1 shows a basic perspective diagram of a housing 1 according to the invention with a component installation space 2 for (not shown) plug-in assemblies that are arranged vertically in the component installation space 2. Usually, the plug-in assemblies are supported in guide rails within the component installation space 2. Above the component installation space 2 there is a fan space 3 that contains an axial fan 4. The fan space 3 is bounded upward by a cover plate 5 and downward by an intermediate plate 6. The optimal intermediate plate 6 separates the component installation space 2 from the fan space 3.

FIG. 1 shows the rear side of the housing, on which the air outlet 7 of the fan space 3 is to be seen. The air outlet 7 is arranged on one of the housing sides 10, advantageously on the rear side.

The axial fan 4 draws air from the component installation space 2, with this air preferably flowing through the component installation space 2 essentially in the vertical direction. This cooling air usually passes through an air-conduction space into the component installation space 2 that is arranged underneath the component installation space 2. In many embodiments, the air-conduction space has an air inlet opening on the front side of the housing.

Figure 2:
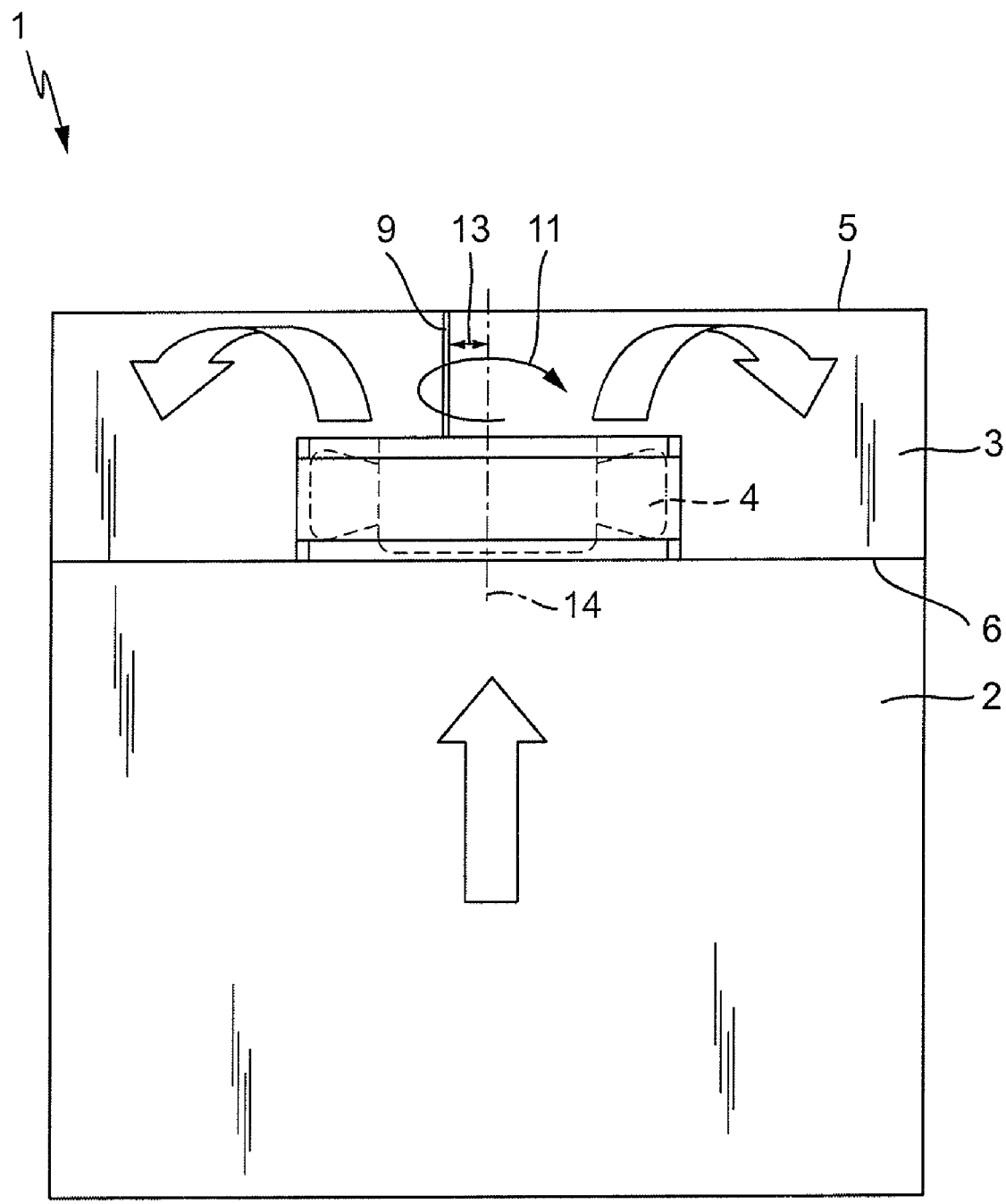
FIGS. 2 and 3 are side views of the housing from FIG. 1.

According to the invention, an air-guiding plate 9 is arranged between the cover plate 5 and a top side 8 of the axial fan 4. The air-guiding plate 9 is preferably arranged vertically in the fan space, as shown in FIGS. 1-3.

In one preferred embodiment, the air-guiding plate 9 in the fan space 3 extends from a side wall 10 opposite the air outlet 7 in the direction of the air outlet 7 of the fan space 3.

Figure 3:
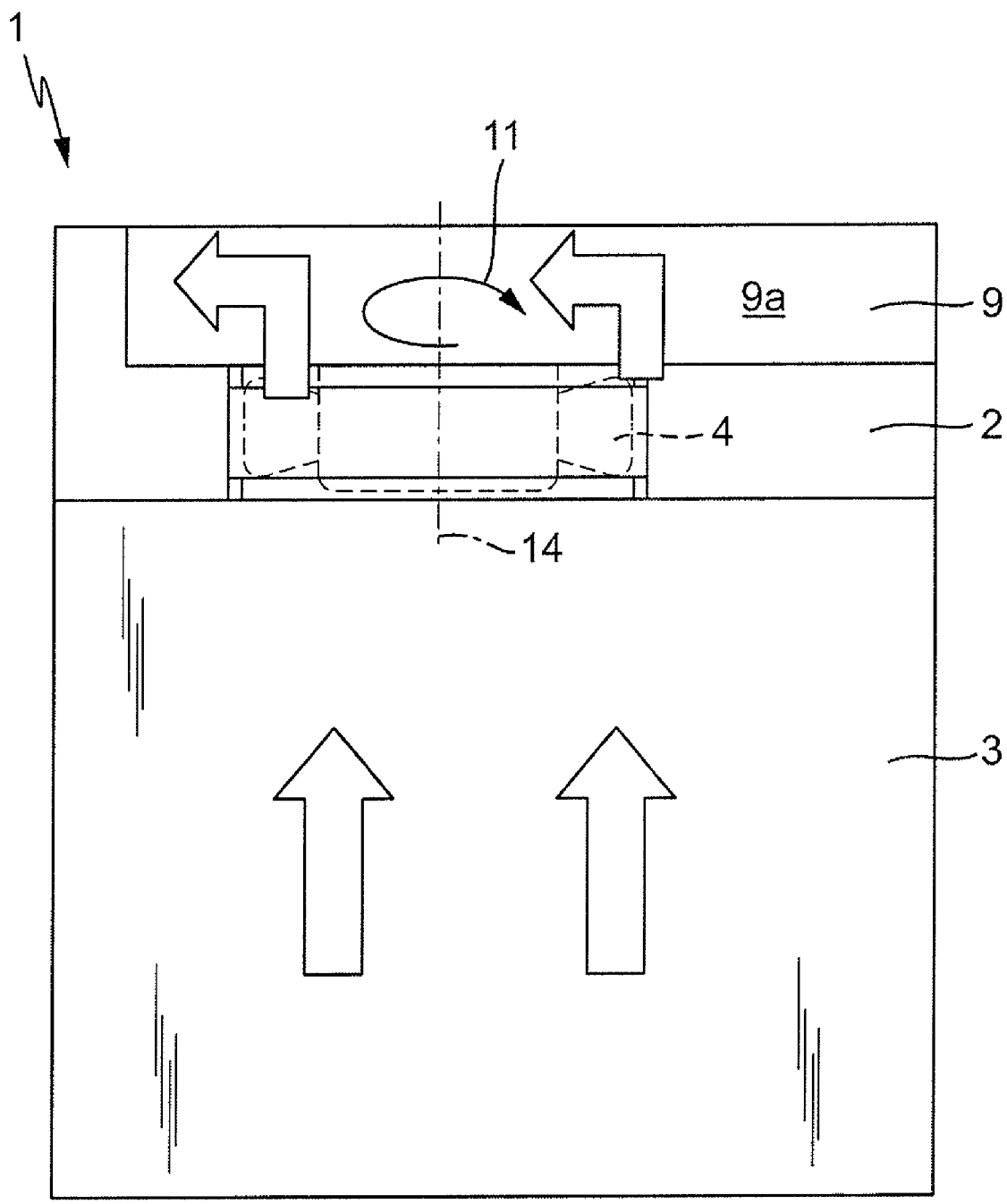

FIGS. 1 and 3 show that one end of the air-guiding plate 9 is spaced apart from the air outlet 7 on the housing wall. The air-guiding plate 9 does not take up the entire space (the dimension of the space in the direction of the air-guiding plate 9).

The air-guiding plate 9 is positioned between the cover plate 5 and the top side 8 of the fan such that the normal line of the surface of the flat side 9a of the air-guiding plate is oriented perpendicular to the fan axis 14. The rotational axis of the axial fan 4 is designated as the fan axis 14 about which the fan wheel rotates.

Due to the high rotational speed of the axial fan 4, without the use of the air-guiding plate 9 a column of air would form above the axial fan 4. The column of air would have the same rotational direction as the axial fan 4 and is indicated by an arrow 11. Through the arrangement of the air-guiding plate 9 on the top side 8 of the axial fan 4, this column of air cannot form. Air eddies are thereby strongly reduced.

The air-guiding plate 9 is arranged in the fan space 3 such that it extends above the air outlet 12 of the axial fan 4 and has a defined distance 13 to the fan axis 14. Within the framework of the invention, the distance 13 is defined as the distance oriented to the line normal to the surface of the flat side 9a of the air-guiding plate that is perpendicular to a plane formed parallel to the air-guiding plate 9. Thus, the air-guiding plate 9 is preferably arranged parallel to a side wall 10 of the housing 1.

An arrangement of the air-guiding plate in which the distance 13 from the fan axis 14 of the axial fan 4 is defined is also preferred. In one preferred embodiment, the distance 13 can be up to 70% of the radius of the air outlet 12. In an especially preferred way, the distance is up to 50% of the radius of the air outlet 12. Studies within the framework of the invention have shown that at a distance 13 of up to 30% of the radius of the air outlet 12, very good results were achieved for air conduction and heat-discharge efficiency. A limitation of the distance 13 to up to 10% of the radius of the air outlet 12 has also shown good improvements. In FIG. 2 it is to be seen that the distance 13 selected here equals about 20% of the radius of the air outlet 12.

Other studies have shown that the position of the air-guiding plate 9 within the fan space 3 is also dependent on the distance to the side wall 10 of the fan space 3.

As shown in FIGS. 1-3, the size of the air-guiding plate 9 is preferably vertically dimensioned so that the air-guiding plate 9 directly abuts the cover plate 5 and the top side 8 of the fan. The total available space (distance between cover plate 5 and top side 8) is filled by the air-guiding plate 9.

Alternatively, it is possible that the air-guiding plate 9 does not extend across the entire distance between the top side 8 and the cover plate 5, so that instead there is a gap between the top edge of the air-guiding plate 9 and the cover plate 5. The size of the gap preferably equals up to half the distance between the top side 8 of the fan and the cover plate 5.

In one preferred embodiment, the vertical dimension of the air-guiding plate 9 is at least 40%, preferably at least 70%, and especially preferred at least 95% of the distance between the cover plate 5 of the fan space 3 and the top side 8 of the fan. The larger the vertical dimension of the air-guiding plate 9 with respect to the free height above the top side 8 of the fan, the more reliably columns of air are prevented and backward-flowing leakage is excluded.

Figure 4:
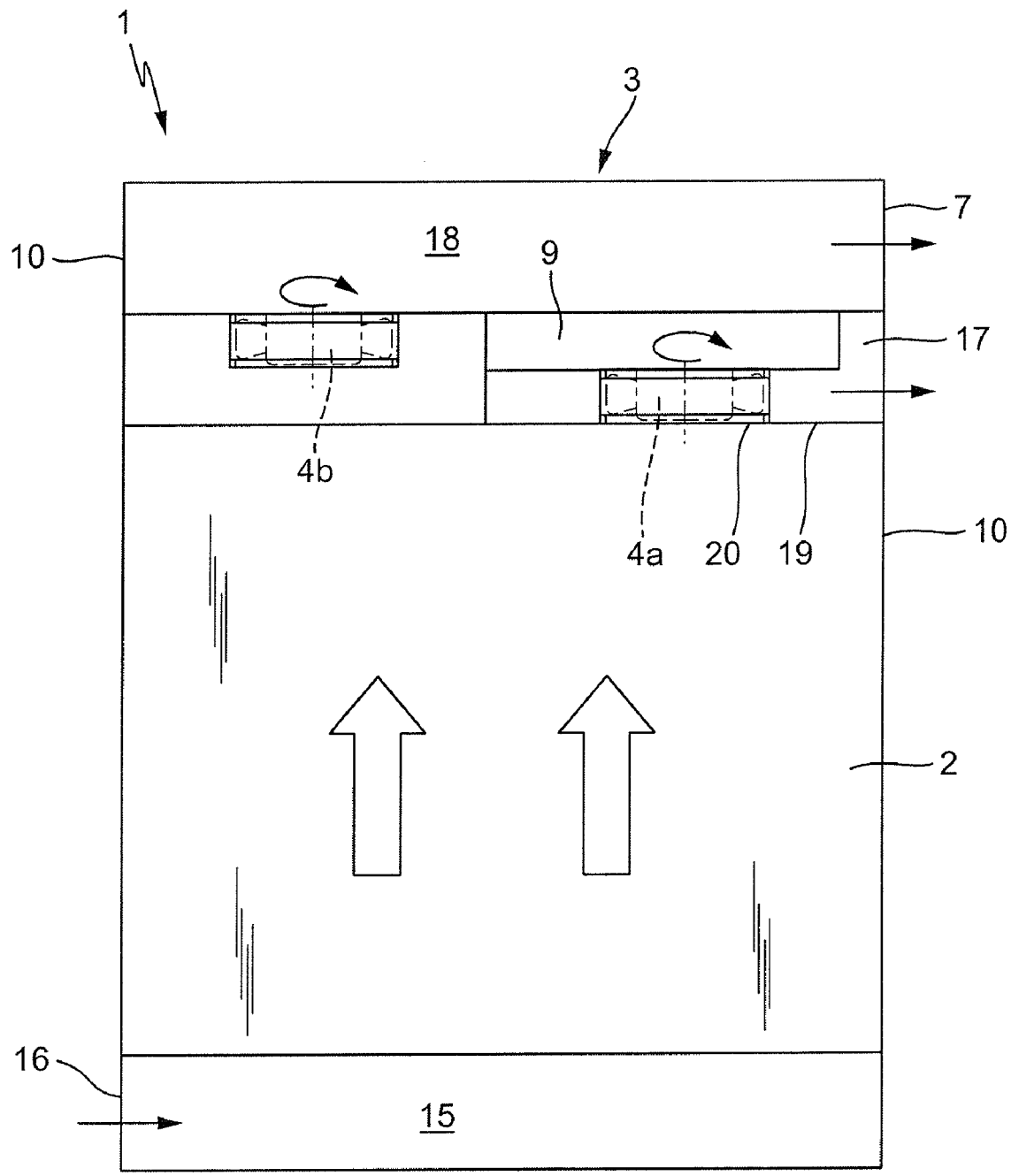
FIG. 4 is an alternative embodiment of a housing according to the invention.

FIG. 4 shows an alternative embodiment of a housing 1 according to the invention in which two axial fans 4a, 4b are arranged. Underneath the component installation space 2 there is an air storage space 15 through whose air inlet 16 cooling air can flow into the housing 1. The cooling air is drawn by the two axial fans 4a, 4b, so that it flows vertically through the component installation space 2 between the plug-in assemblies (not shown here) and cools these assemblies. In the fan space 3, two air-conduction spaces 17, 18 are formed that end at the rear side wall 10 (right side wall in FIG. 4) of the housing 1. The cooling air flowing through the component installation space 2 is guided through the air-conduction spaces 17, 18 and emerges from the air outlet 7 of the housing 1. The two axial fans 4a, 4b are arranged in different vertical positions within the housing 1, so that the air-conduction space 18 that is separated from the air-conduction space 17 extends partially above the air-conduction space 17.

FIG. 4 shows the height (vertical direction) of the air-conduction space 18 to be greater than that of the air-conduction space 17. The effect of leakage flow therefore mainly takes place in the air-conduction space 17 since the air striking the cover plate 5 of the air-conduction space 17 is forced back opposite the direction of flow. The air-guiding plate 9 is therefore mounted only in the lower air-conduction space 17. It is arranged in the way described above, wherein it does not extend across the entire width of the air-conduction space 17.

In one alternative embodiment, the housing 1 can have an intermediate floor 19 between the fan space 3 and the component installation space 2. The intermediate floor 19 has an opening 20 above which the axial fan 4a is arranged so that the bottom side of the fan 4a contacts the intermediate floor 19.

In FIG. 4, the intermediate floor 19 is arranged between the air-conduction space 17 and the component installation space 2. The axial fan 4a is positioned above the opening 20, wherein the opening 20 corresponds to an air inlet of the axial fan 4a. In this way, the axial fan 4a can be mounted on the intermediate floor 19.

Figure 5:
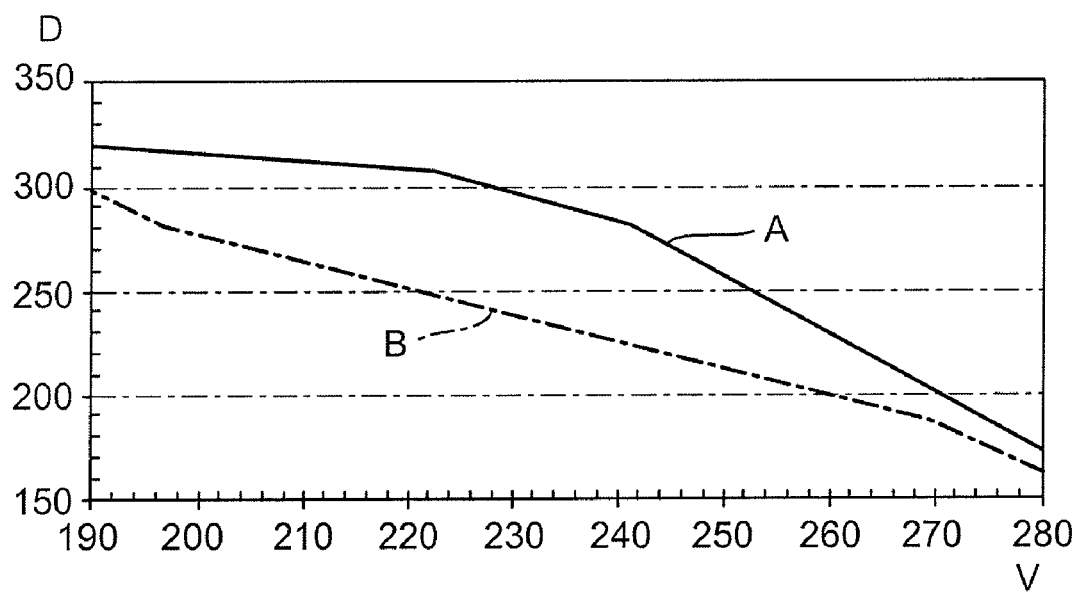
FIGS. 5 and 6 are diagrams for the action of an air-guiding plate in a fan space of a housing.
Figure 6:
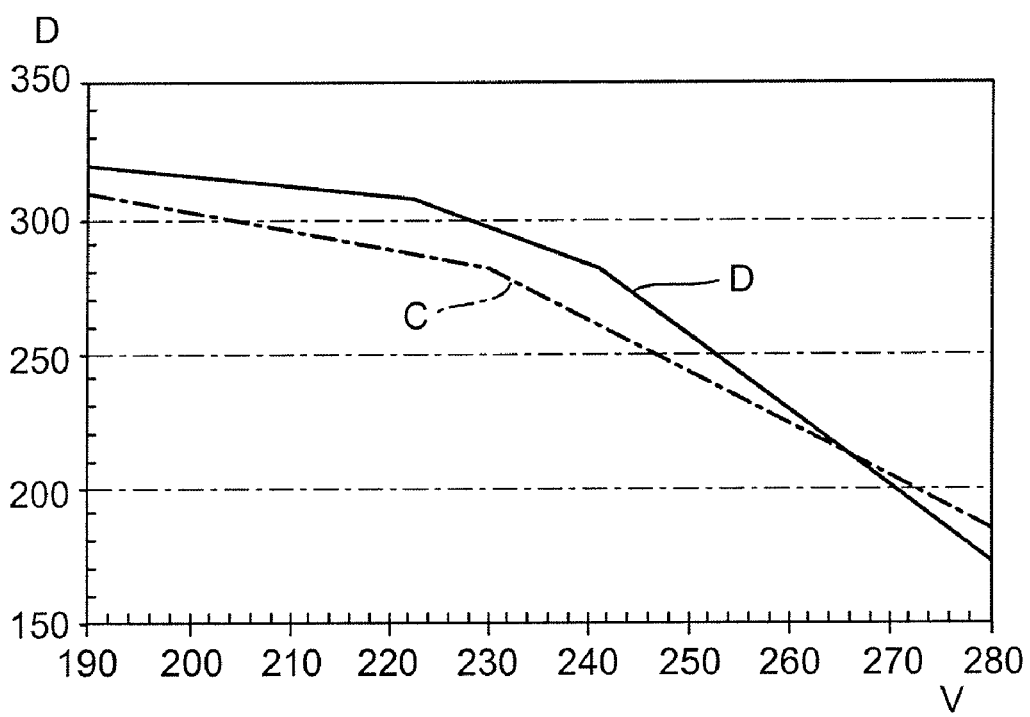

Study results related to improvements achieved through the use of the air-guiding plate 9 are shown in FIGS. 5 and 6. The two figures show the pressure difference D achieved versus air volume flow V. The axial fans 4 used here have a working range in which an air volume flow V of about 200-270 m$^3$/h (cubic meters per hour) is achieved. The higher the achieved pressure difference, the better the effectiveness and the ventilation of the housing.

In FIG. 5, curve B shows the effectiveness of the axial fan 4 that is used without the use of an air-guiding plate 9. Curve A represents the pressure difference D with the use of an air-guiding plate 9 as described with reference to the previous figures. It is clear that, even in the working range of the fan 4, the effectiveness and thus the cooling of the housing 1 is increased significantly.

FIG. 6 shows the achieved pressure difference within the housing 1 for two different arrangements of the air-guiding plate. Curve C shows the arrangement of the air-guiding plate 9 above the fan axis 14. Curve D shows the pressure difference for an arrangement of the air-guiding plate 9 at a distance of about 10 mm from the fan axis 14, where the distance 13 to the fan axis 14 is defined so that the air-guiding plate 9 is aligned parallel to one of the side walls 10 of the housing 1. The distance 13 of 10 mm used here corresponds to approximately 10% of the radius of the axial fan 4 used. It can also be seen here that the effectiveness of the fan 4 that is used can be improved by an optimized arrangement of the air-guiding plate 9 within the fan space 3. In particular, in the working range of the fan 4, an increase of approximately 5% is achieved.

The foregoing description is of an exemplary and preferred embodiments employing at least in part certain teachings of the invention. The invention, as defined by the appended claims, is not limited to the described embodiments. Alterations and modifications to the disclosed embodiments may be made without departing from the invention. The meaning of the terms used in this specification are, unless expressly stated otherwise, intended to have ordinary and customary meaning and are not intended to be limited to the details of the illustrated structures or the disclosed embodiments.

What is claimed is:

1. A housing for holding electronic plug-in assemblies comprising:
   a component installation space open toward the front side of the housing for the plug-in assemblies;
   a fan space arranged above the component installation space, the fan space being at least defined in part by a cover plate and having an air outlet of the fan space lateral to the cover plate; at least one axial fan with an air outlet on the top side of the axial fan, the axial fan being arranged in the fan space such that air is drawn from the component installation space; and
   an air-guiding plate that runs in the direction of the air outlet of the fan space, the air-guiding plate being positioned above and extending across the air outlet of the axial fan between the top side of the axial fan and the cover plate of the fan space, the air-guiding plate being oriented perpendicular to the air outlet of the axial fan.

2. A housing according to claim 1, wherein the air-guiding plate runs from a side wall of the fan space opposite the air outlet in the direction of the air outlet of the fan space.

3. A housing according to claim 1, wherein the air-guiding plate is arranged vertically in the fan space.

4. A housing according to claim 1, wherein the air-guiding plate is arranged in the fan space such that it has a defined distance to the axis of the fan.

5. A housing according to claim 4, wherein the distance between the air-guiding plate and the fan axis of the axial fan equals up to 70% of the radius of the air outlet of the axial fan.

6. A housing according to claim 1, wherein
   the housing has an intermediate floor between the fan space and the component installation space, the intermediate floor having an opening; and
   the fan is arranged above the opening of the intermediate floor such that the bottom side of the fan contacts the intermediate floor.

7. A housing according to claim 1, wherein the vertical dimension of the air-guiding plate is at least 40% of the distance between the cover plate of the fan space and the top side of the fan.

8. A housing according to claim 1, wherein the fan space contains at least two axial fans that are arranged one next to the other such that one of the two axial fans is arranged close to the air outlet of the fan space and the other axial fan is arranged close to a side wall opposite the air outlet of the fan space.

9. A housing according to claim 8, further comprising a separate air-conduction space for each of the two fans.

10. A housing according to claim 9, wherein the separate air-conduction spaces are arranged at least partially one above the other.

11. A housing according to claim 10, wherein the air-guiding plate is arranged in the air-conduction space of the axial fan adjacent to the air outlet.

12. A housing for holding electronic plug-in assemblies comprising:
   a component installation space open toward the front side of the housing for the plug-in assemblies;
   a fan space arranged above the component installation space, defined at least in part by a cover plate and having an air outlet of the fan space lateral to the cover plate; at least one axial fan with an air outlet on the top side of a fan, the axial fan being arranged in the fan space such that air is drawn from the component installation space; and
   an air-guiding plate that runs in the direction of the air outlet of the fan space is positioned between the top side of the axial fan and the cover plate of the fan space;
   wherein the air-guiding plate runs from a side wall of the fan space opposite the air outlet in the direction of the air outlet of the fan space; and
   wherein the air-guiding plate is arranged in the fan space such that it extends above and across the air outlet of the axial fan and has a defined distance to the axis of the fan, the air-guiding plate being oriented perpendicular to the air outlet of the axial fan.

13. A housing according to claim 12, wherein
   the housing has an intermediate floor between the fan space and the component installation space, the intermediate floor having an opening; and
   the fan is arranged above an opening of the intermediate floor such that the bottom side of the fan contacts the intermediate floor.

14. A housing according to claim 12, wherein the vertical dimension of the air-guiding plate is at least 40% of the distance between the cover plate of the fan space and the top side of the fan.

15. A housing according to claim 12, wherein the fan space contains at least two axial fans that are arranged one next to the other such that one of the two axial fans is arranged close to the air outlet of the fan space and the other axial fan is arranged close to the side wall opposite the air outlet of the fan space.

16. A housing for holding electronic plug-in assemblies comprising:
   a component installation space open toward the front side of the housing for the plug-in assemblies;
   a fan space arranged above the component installation space, the fan space being at least defined in part by a cover plate and having an air outlet of the fan space lateral to the cover plate; at least one axial fan with an air outlet on the top side of a fan; the axial fan being arranged in the fan space such that air is drawn from the component installation space; and
   an air-guiding plate that runs in the direction of the air outlet of the fan space, the air-guiding plate being positioned between the top side of the axial fan and the cover plate of the fan space, the air-guiding plate being arranged vertically in the fan space and extending across and above an air outlet of the axial fan to one side of an axis of the axial fan.

17. A housing according to claim 16, wherein
   the housing has an intermediate floor between the fan space and the component installation space, the intermediate floor having an opening; and
   the fan is arranged above an opening of the intermediate floor such that the bottom side of the fan contacts the intermediate floor.

18. A housing according to claim 16, wherein the vertical dimension of the air-guiding plate is at least 40% of the distance between the cover plate of the fan space and the top side of the fan.

19. A housing according to claim 16, wherein the fan space contains at least two axial fans that are arranged one next to the other such that one of the two axial fans is arranged close to the air outlet of the fan space and the other axial fan is arranged close to the side wall opposite the air outlet of the fan space.

20. A housing according to claim 16, wherein the air-guiding plate runs from a side wall of the fan space opposite the air outlet in the direction of the air outlet of the fan space.

* * * * *

UNITED STATES PATENT AND TRADEMARK OFFICE
CERTIFICATE OF CORRECTION

| | | |
|---|---|---|
| PATENT NO. | : 7,944,693 B2 | Page 1 of 1 |
| APPLICATION NO. | : 12/393376 | |
| DATED | : May 17, 2011 | |
| INVENTOR(S) | : Heinz Kempf | |

It is certified that error appears in the above-identified patent and that said Letters Patent is hereby corrected as shown below:

In the Claims:

At column 8, claim number 16, line number 15, please delete the phrase "the top side of a fan" and replace with the phrase -- a top side of the fan --.

Signed and Sealed this
Twelfth Day of July, 2011

David J. Kappos
*Director of the United States Patent and Trademark Office*